United States Patent
Miura

[19]

[11] Patent Number: 6,016,565
[45] Date of Patent: *Jan. 18, 2000

[54] SEMICONDUCTOR DEVICE TESTING APPARATUS

[75] Inventor: Takeo Miura, Tatebayashi, Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/874,669

[22] Filed: Jun. 13, 1997

[30] Foreign Application Priority Data

Jun. 14, 1996 [JP] Japan .................................. 8-153779

[51] Int. Cl.[7] .................................................. G01R 31/28
[52] U.S. Cl. .......................................................... 714/736
[58] Field of Search ................................. 371/25.1, 21.2, 371/22.5, 27.1, 21.1, 22.1, 22.36, 22.6, 27.7, 28; 395/180, 182.03, 183.01, 183.08, 183.15, 183.18, 185.01, 183.06; 364/579, 489, 490, 550; 324/150.1; 365/201; 714/736, 25

[56] References Cited

U.S. PATENT DOCUMENTS

| | | | |
|---|---|---|---|
| 5,191,281 | 3/1993 | Ohashi | 324/158 R |
| 5,305,329 | 4/1994 | Sasaki | 371/27 |
| 5,471,484 | 11/1995 | Kawasaki | 371/25.1 |
| 5,539,699 | 7/1996 | Sato et al. | 365/201 |
| 5,579,251 | 11/1996 | Sato | 364/579 |
| 5,590,137 | 12/1996 | Yamashita | 371/27 |
| 5,604,756 | 2/1997 | Kawata | 371/67.1 |
| 5,646,948 | 7/1997 | Kobayashi et al. | 371/21.2 |
| 5,659,553 | 8/1997 | Suzuki | 371/25.1 |
| 5,732,047 | 3/1998 | Niijima | 368/10 |

*Primary Examiner*—Robert W. Beausoliel, Jr.
*Assistant Examiner*—Nadeem Iqbal
*Attorney, Agent, or Firm*—Staas & Halsey

[57] ABSTRACT

A strobe generator includes four strobe pulse generators generating original strobe pulses having the same frequency, respectively, and correspondingly, four logical comparator circuits, the number of which is identical to that of the strobe pulse generators. Further, a mode selection circuit is provided which can set any one of mode 1, mode 2 and mode 3. In mode 1, an output signal V from a level comparator is latched by a new high speed strobe signal having a frequency four times the frequency of the original strobe pulse, and the latched signals are sequentially compared with expected value data signals. In mode 2, an output signal V from the level comparator is latched by two new high speed strobe signals having a frequency two times the frequency of the original strobe pulse, and the latched signals are sequentially compared with the expected value data signals. In mode 3, an output signal V from the level comparator is latched by four new strobe signals having the same frequency as the frequency of the original strobe pulse and different phases from one another, and the latched signals are sequentially compared with the expected value data signals.

14 Claims, 12 Drawing Sheets

MODE 3

DELAY IN PHASE OF ORIGINAL STROBE SIGNAL

| MODE \ STRB SIG | SA' | SB' | SC' | SD' |
|---|---|---|---|---|
| M 1 | 0 (REF) | T/4 | 2T/4 | 3T/4 |
| M 2 | 0 | 0 | T/2 | T/2 |
| M 3 | 0 | 0 | 0 | 0 |

FIG. 9

| DELAY DATA<br>MODE | S1D | S2D | S3D | S4D | REMARKS |
|---|---|---|---|---|---|
| M 1 | $\tau 1$ | $\tau 1$ | $\tau 1$ | $\tau 1$ | $0 \leq \tau 1 < T/4$ |
| M 2 | $\tau 2\text{-}1$ | $\tau 2\text{-}2$ | $\tau 2\text{-}1$ | $\tau 2\text{-}2$ | $0 \leq \tau 2\text{-}1 < \tau 2\text{-}2 < T/2$ |
| M 3 | $\tau 3\text{-}1$ | $\tau 3\text{-}2$ | $\tau 3\text{-}3$ | $\tau 3\text{-}4$ | $0 \leq \tau 3\text{-}1 < \tau 3\text{-}2$<br>$< \tau 3\text{-}3 < \tau 3\text{-}4 < T$ |

FIG. 10

SEMICONDUCTOR DEVICE TESTING APPARATUS

BACKGROUND OF THE INVENTION

1. Field of the Invention

The present invention generally relates to a semiconductor device testing apparatus for testing various kinds of semiconductor devices, and more particularly, relates to an improvement in the logical comparison part of a semiconductor device testing apparatus for testing one or more semiconductor integrated circuits (hereinafter referred to as IC or ICs) which are a typical example of semiconductor devices, specifically, one or more IC memories such as a RAM (random access memory), a ROM (read only memory), a charge coupled device (CCD) or the like, as to the quality thereof, that is, whether it is a good (pass) article or a defective (failure) article.

Further, in order to make the understanding of the present invention easier, in the following disclosure the present invention will be described with a case that the present invention is applied to an IC memory testing apparatus for testing one or more IC memories as to whether it is a good (pass) article or a defective (failure) article. However, it is needless to say that the present invention can also be applied to a semiconductor device testing apparatus for testing one or more ICs other than an IC memory or one or more semiconductor devices other than an IC as to whether it is a pass article or a failure article.

2. Description of Related Art

An IC memory testing apparatus comprises, roughly speaking, a timing generator (strobe generator), a pattern generator, a waveform shaping device, a logical comparison circuit, and a failure analysis memory. The pattern generator generates, in response to a reference clock supplied from the timing generator, an address signal, a series of test data signals having a predetermined pattern and a control signal which are to be supplied to an IC memory to be tested (commonly called a device under test (DUT)), and generates an expected value data signal to be supplied to the logical comparison circuit, and the like. The address signal, the test data signal and the control signal are inputted once to the waveform shaping device where those signals are shaped to have the waveforms required for testing an IC memory to be tested, and then are applied to the IC memory to be tested.

An IC memory to be tested is controlled in writing or reading of test data thereinto or therefrom by an application of a control signal thereto. That is, when a control signal for writing is applied to the IC memory to be tested, test data is successively written into addresses of the IC memory to be tested, each address being specified by a corresponding address signal. When a control signal for reading is applied to the IC memory to be tested, written test data is successively read out from addresses of the IC memory to be tested, each address being specified by an address signal.

The read-out data signals read out from the IC memory to be tested are supplied to the logical comparison circuit where each of the read-out data signals is compared with an expected value data signal outputted from the pattern generator. When the comparison result is a discord, the logical comparison circuit outputs a defect signal what is called a failure (or fail) signal indicating the discord. Usually, a logical "1" is outputted as a failure signal. On the contrary, when the comparison result is an accord, the logical comparison circuit outputs a conformable signal what is called a pass signal which indicates the conformity. Since a failure signal is a logical "1", a logical "0" is outputted as a pass signal. A failure signal is sent to a failure analysis memory and is stored therein, but a pass signal is usually not stored in the failure analysis memory.

After the completion of one test cycle, it is decided whether the tested IC memories is pass articles or failure articles, by taking into consideration the number of failure signals, the locations of occurrences of failure signals and the like stored in the failure analysis memory.

An example of a conventional IC testing apparatus of this type for testing an IC memory as to whether it is a pass article or a failure article will be described with reference to FIG. 11 which shows mainly the arrangement of the logical comparison part thereof.

In each of a series of test periods constituting one test cycle, a response signal read out from each terminal (pin) of an IC memory to be tested 1 is supplied first to a corresponding level comparator 2 where its signal level (usually voltage level) is compared with a reference level. There are two reference levels one of which is a reference voltage VOH which is used when an output from an IC memory to be tested is logical "1" and the other of which is a reference voltage VOL which is used when an output from an IC memory to be tested is logical "0". In the illustrated circuit construction, in case the reference voltage VOH is used, a logical "1" is outputted from the level comparator 2 when the comparison result is a pass and a logical "0" is outputted from the level comparator 2 when the comparison result is a failure. In case the reference voltage VOL is used, a logical "0" is outputted from the level comparator 2 when the comparison result is a pass and a logical "1" is outputted from the level comparator 2 when the comparison result is a failure. Although only one circuit construction for one pin of the IC memory 1 is shown in the drawing, the circuit construction for each of other pins is the same as that shown in the drawing.

An output signal V (FIG. 12a) from the level comparator 2 is supplied to a logical comparison circuit 5 which is constituted by two logical comparator circuits 5a and 5b. The output signal V is branched into two parts one of which is supplied to the logical comparator circuit 5a and the other of which is supplied to the logical comparator circuit 5b. Both the logical comparator circuits 5a and 5b have the same circuit arrangement and comprise latch circuits 3a and 3b and exclusive OR (XOR) gates 4a and 4b, respectively. An output signal V from the level comparator 2 is supplied to both the latch circuits 3a and 3b of the respective logical comparator circuits 5a and 5b. Strobe signals Sa and Sb (FIGS. 12b and 12c) having the same frequency (for example, 100 MHz) and phases different from each other respectively are supplied from the strobe generator (timing generator) 6 to clock terminals of these latch circuits 3a and 3b respectively to latch the output signal V from the level comparator 2 into the latch circuits 3a and 3b at the fall time points (edges) of the strobe signals, respectively. That is, the branched output signals V are latched at the fall edges of the strobe signals into the latch circuits 3a and 3b, respectively.

The output signal V from the level comparator 2 is updated for every test period T in one test cycle. Each test period T is equal to the period of each of the strobe signals Sa and Sb. Assuming that the frequency of each strobe signal is fs, the test period T is equal to 1/fs, namely, T=1/fs.

The output signals of the latch circuits 3a and 3b are inputted to one input terminals of the corresponding exclusive OR gates 4a and 4b of the logical comparator circuits 5a and 5b respectively where they are logically compared with expected value data signals Ea and Eb outputted from the pattern generator, respectively. Since the expected value data signals Ea and Eb are ones which have the same logic as that of the test data signal applied to the IC memory 1 to be tested, in case that an output from the IC memory 1 to be tested is to be a logical "1", the expected value data signals Ea and Eb inputted respectively to the other terminals of the XOR gates 4a and 4b are logical "1". Also, in case that an output from the IC memory 1 to be tested is to be a logical "0", the expected value data signals Ea and Eb inputted respectively to the other terminals of the XOR gates 4a and 4b are logical "0". Thus, in case that a logical "1" signal is inputted to the latch circuits 3a and 3b from the level comparator 2 when an output from the IC memory 1 to be tested is to be a logical "1", this logical "1" signal coincides with the expected value data signal (logical "1"). As a result, logical "0" signals, i.e., pass signals are generated from the XOR gates 3a and 3b, respectively. Whereas, when a logical "0" signal is inputted to the latch circuits 3a and 3b, this logical "0" signal does not coincide with the expected value data signal (logical "1"). As a result, logical "1" signals, i.e., failure signals Fa and Fb are generated from the XOR gates 4a and 4b, respectively.

On the other hand, in case that a logical "0" signal is inputted to the latch circuits 3a and 3b from the level comparator 2 when an output from the IC memory 1 to be tested is to be a logical "0", this logical "0" signal coincides with the expected value data signal (logical "0"). As a result, logical "0" signals, i.e., pass signals are generated from the XOR gates 3a and 3b, respectively. Whereas, when a logical "1" signal is inputted to the latch circuits 3a and 3b, this logical "1" signal does not coincide with the expected value data signal (logical "0"). As a result, logical "1" signals, i.e., failure signals Fa and Fb are generated from the XOR gates 4a and 4b, respectively.

These failure signals Fa and Fb are inputted to a failure selection circuit 7 where one of the failure signals Fa and Fb is selected to be written in corresponding one of the failure analysis memories 8a and 8b, or both the failure signals Fa and Fb are written in the corresponding failure analysis memories 8a and 8b, respectively.

As discussed above, the logical comparison part of the conventional IC memory testing apparatus uses only one strobe generator (timing generator) 6 to logically compare the signal level of a response signal read out from each of the terminals of the IC memory 1 to be tested with an expected value data signal at one or two time points (one or two timings) in each test period T of one test cycle, thereby to determine whether the IC memory to be tested is a pass article or a failure article. In such case, since the frequency of a strobe signal depends upon the performance (for example, 100 MHz) of the strobe generator, it cannot be possible to generate a strobe signal having a frequency beyond the performance of the strobe generator. Therefore, it has been impossible in the conventional IC memory testing apparatus to test an IC memory which operates at a high speed (for example, 200 MHz or 400 MHz) beyond the performance of the strobe generator and to determine whether it is a pass article or a failure article.

In addition, in case that, for example, the performance of a DRAM (dynamic RAM) is required to be classified into four categories with respect to the access time thereof, two test cycles are needed to perform such classification in the above-mentioned conventional IC memory testing apparatus because only two systems of strobe signals are available. Consequently, there is a disadvantage in the conventional IC memory testing apparatus that it takes a longer time to perform the classifying operation.

The above problems also occur in a semiconductor device testing apparatus for testing one or more ICs other than an IC memory or one or more semiconductor devices other than an IC as to whether it is a pass article or a failure article if the semiconductor device testing apparatus is provided with a logical comparison part the circuit arrangement of which is similar to that of the conventional IC memory testing apparatus.

Moreover, a request or demand has been recently increased for a semiconductor device testing apparatus that a semiconductor device testing apparatus is available in which each test period in one test cycle and a timing for logical comparison can be variously changed so that all of semiconductor devices from low speed semiconductor devices operating at a low speed to high speed semiconductor devices operating at a high speed can be tested regarding their various performances by only one semiconductor device testing apparatus.

SUMMARY OF THE INVENTION

An object of the present invention is to provide a semiconductor device testing apparatus which can test all of semiconductor devices from low speed semiconductor devices operating at a low speed to high speed semiconductor devices operating at a high speed regarding their various performances without using any strobe generator which operates at a high speed.

An another object of the present invention is to provide a semiconductor device testing apparatus which can reduce a time duration for testing semiconductor devices using a plurality of strobe generators each of which operates at a low speed.

In one aspect of the present invention, there is provided a semiconductor device testing apparatus wherein a series of test data signals of a predetermined pattern is applied to a semiconductor device to be tested, a read-out data signal read out from the semiconductor device is logically compared with an expected value data signal in a logical comparison circuit, and when the result of comparison is a discord, a failure signal indicating the discord is outputted to be stored in a failure analysis memory, and which comprises: a plurality of strobe generators for generating original strobe signals having the same frequency, respectively; a plurality of logical comparator circuits, each logical comparator circuit logically comparing a portion of the read-out data signal from the semiconductor device latched thereinto by corresponding one original strobe signal with an expected value data signal supplied thereto, and when the result of comparison is a discord, generating a failure signal, the number of the logical comparator circuits being equal to that of the strobe generators; a strobe control circuit provided between the plurality of strobe generators and the plurality of logical comparator circuits, for giving predetermined amounts of delay time to original strobe signals generated from the plurality of strobe generators respectively, thereby controlling timings for latching the read-out data signal from the semiconductor device into the corresponding logical comparator circuits; and a mode selection circuit for at least generating, in each test period of a plurality of test periods constituting one test cycle, a first mode signal which selects a first test mode in which the read-out data signal from the semiconductor device can be latched into the corresponding logical comparator circuits by a new strobe signal of a frequency having the frequency of the original strobe signal multiplied by the number of the strobe generators, and a second mode signal which selects a second test mode in which the read-out data signal from the semiconductor device can be latched into the corresponding logical comparator circuits by a plurality of new strobe signals having the same frequency as that of the original strobe signal and different phases from one another at a plurality of timings.

In a preferred embodiment, the mode selection circuit supplies selected one of the mode signals to the strobe control circuit, and the strobe control circuit changes, in response to the supplied mode signal, the amount of delay time given to the original strobe signal.

In a further preferred embodiment, the mode selection circuit supplies selected one of the mode signals to the strobe control circuit and the plurality of strobe generators, and the strobe control circuit changes, in response to the supplied mode signal, the amount of delay time given to the original strobe signal, and each of the plurality of strobe generators changes, in response to the supplied mode signal, the phase of the associated original strobe signal to output it.

In a still further preferred embodiment, the strobe control circuit comprises: a delay circuit having a plurality of delay means each giving a predetermined amount of delay time to the associated original strobe signal outputted from each of the plurality of strobe generators; a delay data generator for previously storing therein delay data corresponding to the amounts of delay time set in the plurality of delay means; and a gate circuit having a plurality of gate means for selectively giving the delay data from the delay data generator to the plurality of delay means, and wherein the delay data generator outputs, in response to a mode signal supplied thereto from the mode selection circuit, the corresponding delay data; and one or more predetermined gate means of the gate circuit are enabled in response to a mode signal supplied thereto from the mode selection circuit.

In an another aspect of the present invention, the number of the plurality of strobe generators and the plurality of logical comparator circuits are equal to or larger than four, respectively, and the mode selection circuit generates at least, in each test period of a number of test periods constituting one test cycle, a first mode signal which selects a first test mode in which the read-out data signal from the semiconductor device can be latched into the corresponding logical comparator circuits by a new strobe signal of a frequency four times the frequency of the original strobe signal or higher than four times, a second mode signal which selects a second test mode in which the read-out data signal from the semiconductor device can be latched into the corresponding logical comparator circuits by a new strobe signal of a frequency two times the frequency of the original strobe signal or higher than two times, and a third mode signal which selects a third test mode in which the read-out data signal from the semiconductor device can be latched into the corresponding logical comparator circuits by four or more new strobe signals having the same frequency as that of the original strobe signal and different phases from one another at four or more timings.

Preferably, the number of the plurality of strobe generators and the plurality of logical comparator circuits are an even number equal to or larger than four, and the strobe generators output, when the first mode signal is supplied thereto from the mode selection circuit, in each test period of a number of test periods constituting one test cycle, their original strobe signals the phases of which are delayed $T/(4+n)$ by $T/(4+n)$ in order, where T is one test period and n is an even number including 0; output, when the second mode signal is supplied thereto from the mode selection circuit, in each test period of a number of test periods constituting one test cycle, the first half of their original strobe signals the phases of which are identical, and then the remaining half of their original strobe signals the phases of which are identical and larger than those of the first half, the phase difference between them being within the time interval of $T/2$ at the maximum; and output, when the third mode signal is supplied thereto from the mode selection circuit, in each test period of a number of test periods constituting one test cycle, their original strobe signals the phases of which are all identical.

The semiconductor device testing apparatus may further include a plurality of failure analysis memories, and a failure selection circuit for selectively supplying the failure signals outputted from the plurality of logical comparator circuits to the failure analysis memories, respectively.

The failure selection circuit selects, in response to a mode signal supplied thereto from the mode selection circuit, the failure analysis memories in which the failure signals supplied thereto from the plurality of logical comparator circuits are to be stored.

BRIEF DESCRIPTION OF THE DRAWINGS

FIG. 9 is a diagram showing the relationship of the phases between the original strobe signals SA', SB', SC' and SD' outputted from the strobe generator used in the IC memory testing apparatus shown in FIG. 1;

FIG. 10 is a diagram for explaining the amounts of delay time of the delay data S1D, S2D, S3D, and S4D outputted from the delay data generator 12 used in the IC memory testing apparatus shown in FIG. 1;

DETAILED DESCRIPTION OF THE PREFERRED EMBODIMENTS

Figure 1:
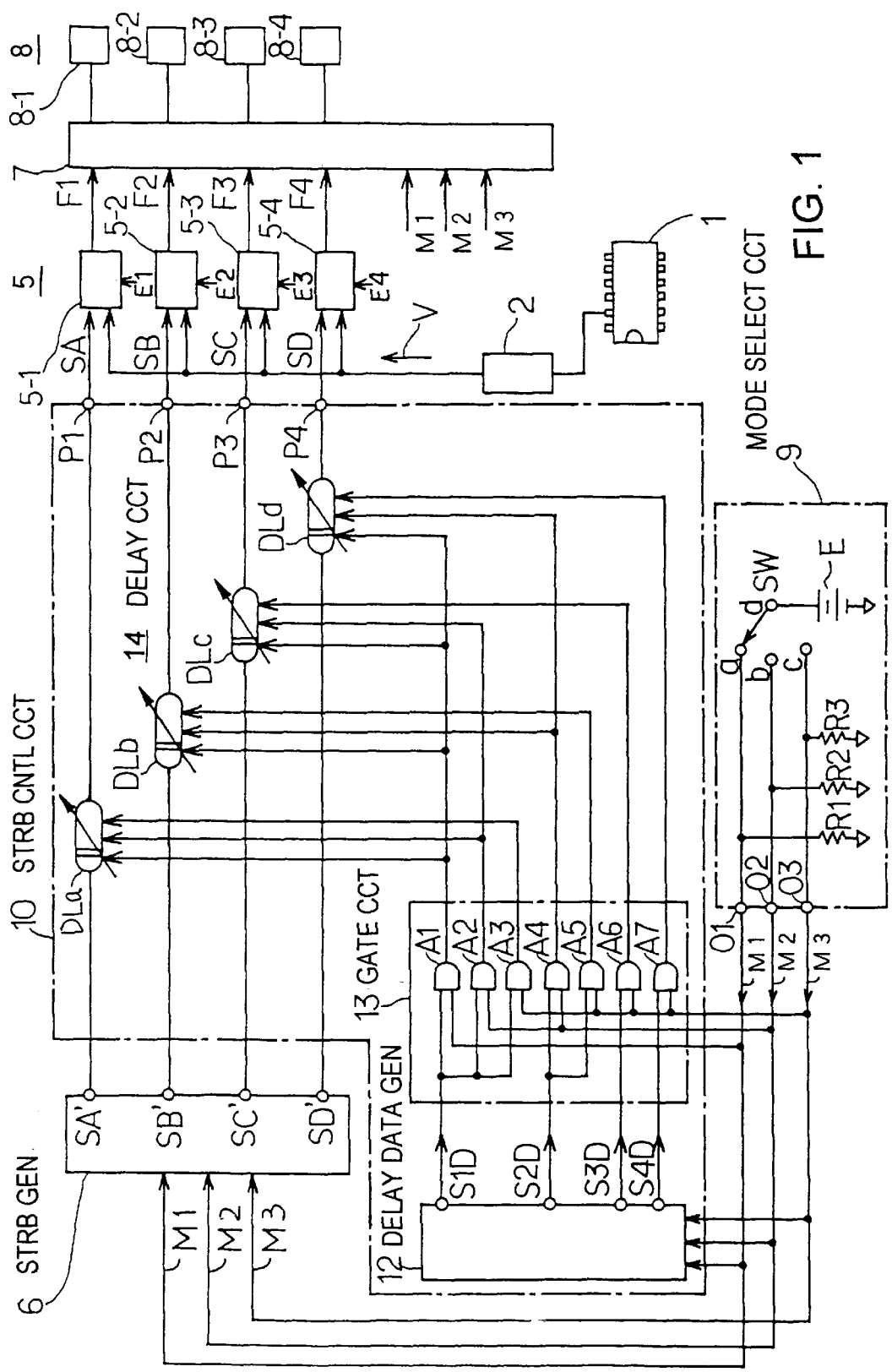
FIG. 1 is a block diagram showing mainly the circuit construction of the logical comparison part of an embodiment of an IC memory testing apparatus according to the present invention.
Figure 11:
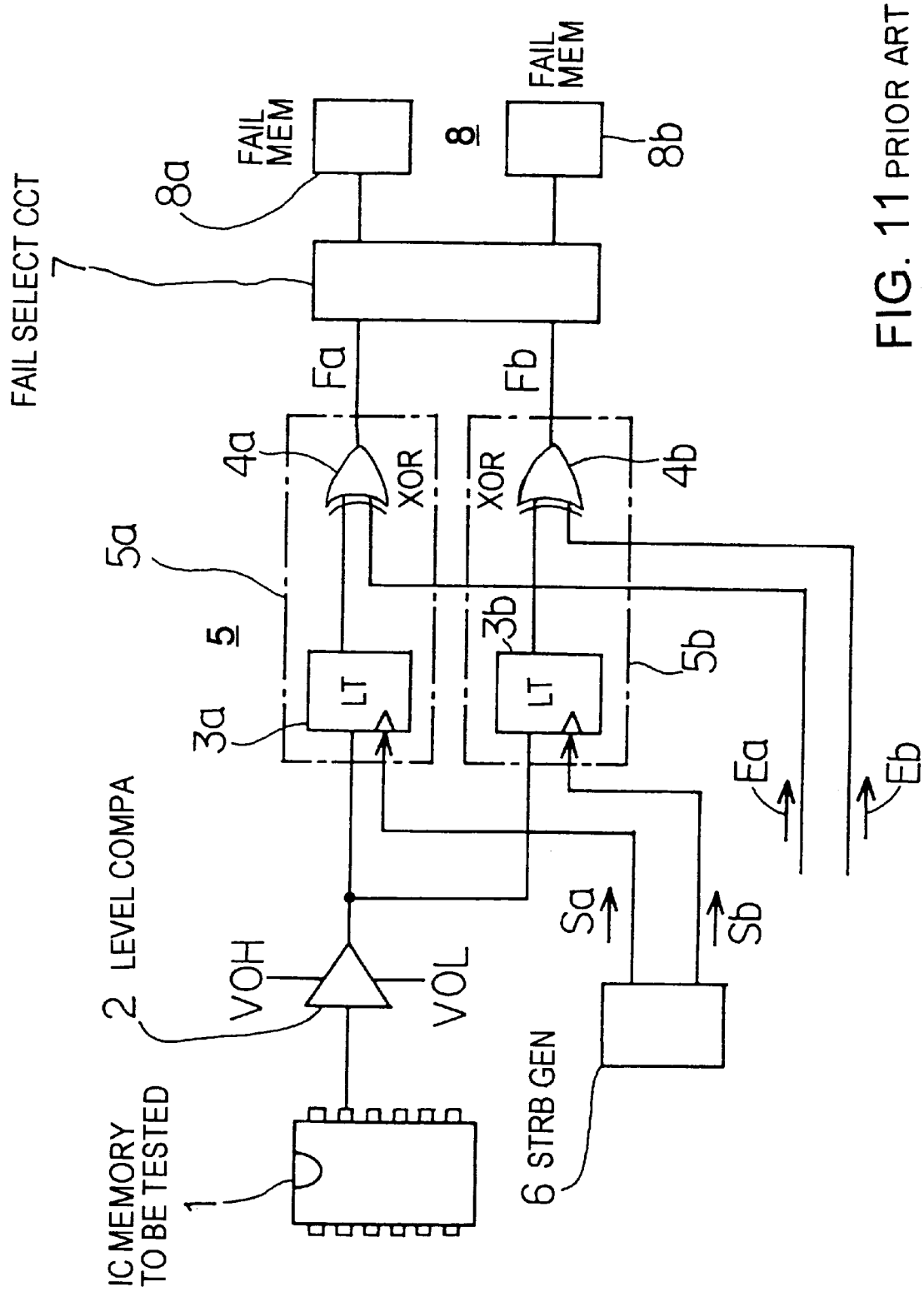
FIG. 11 is a block diagram showing mainly the circuit construction of the logical comparison part of a conventional IC memory testing apparatus.
Figure 12:
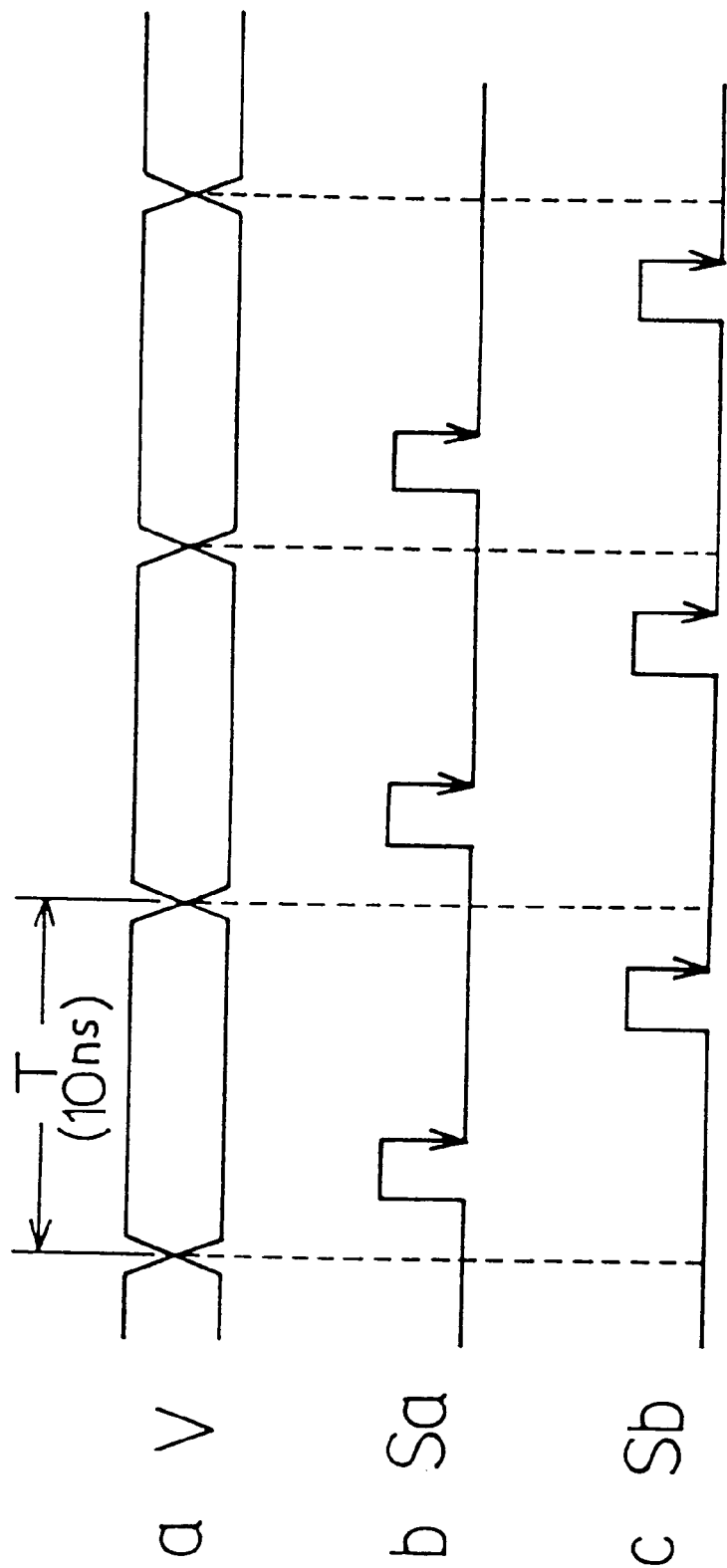
FIG. 12 is a timing chart showing the strobe pulses outputted from the strobe generator used in the conventional IC memory testing apparatus shown in FIG. 11.

Now, the preferred embodiments of the present invention will be described in detail with reference to the accompanying drawings. FIG. 1 shows mainly the circuit construction of a logical comparison part of one embodiment of an IC memory testing apparatus according to the present invention. As with the prior IC memory testing apparatus discussed above with reference to FIG. 11, it comprises a level comparator 2, a logical comparison circuit 5, a strobe generator (timing generator) 6, a failure selection circuit 7, and a failure analysis memory 8.

In this embodiment, the strobe generator 6 is constructed by four, namely, first, second, third and fourth strobe pulse generators for generating original strobe pulses SA', SB', SC' and SD', respectively, and correspondingly, the logical comparison circuit 5 is constructed by four, namely, first, second, third and fourth logical comparator circuits 5-1, 5-2, 5-3 and 5-4, respectively. These logical comparator circuits 5-1–5-4 may have the same circuit construction and each comparator circuit may be constituted, for example, by a latch circuit and an exclusive OR (XOR) gate as with the logical comparison circuit of the prior IC testing apparatus shown in FIG. 11.

The level comparator 2 compares a signal level (usually voltage level) of a read-out data signal read out from corresponding one of terminals (pins) of an IC memory 1 to be tested with a reference level in each of a series of test periods constituting one test cycle. The operation of the level comparator 2 is similar to that of the level comparator of the prior IC testing apparatus mentioned above, and hence further detailed discussion thereof will be omitted.

In this embodiment, a strobe control circuit 10 is disposed between the strobe generator 6 and the logical comparison circuit 5, and the original strobe pulses SA'–SD' outputted from the first to the fourth strobe pulse generators are controlled in their amounts of delayed time by a delay circuit 14 of the strobe control circuit 10 and thereafter supplied to the corresponding logical comparator circuits 5-1–5-4, respectively.

More specifically, the original strobe pulse SA' from the first strobe pulse generator is sent to the first logical comparator circuit 5-1 through a first delay means DLa of the delay circuit 14 in series, the original strobe pulse SB' from the second strobe pulse generator is sent to the second logical comparator circuit 5-2 through a second delay means DLb of the delay circuit 14 in series, the original strobe pulse SC' from the third strobe pulse generator is sent to the third logical comparator circuit 5-3 through a third delay means DLc of the delay circuit 14 in series, and the original strobe pulse SD' from the fourth strobe pulse generator is sent to the fourth logical comparator circuit 5-4 through a fourth delay means DLd of the delay circuit 14 in series.

The strobe control circuit 10 includes, in addition to the delay circuit 14 stated above, a delay or delaying data generator 12 and a gate circuit 13. The delay data generator 12 generates, in the illustrated embodiment, four delay or delaying data, namely, first, second, third and fourth delay or delaying data S1D, S2D, S3D and S4D to supply them to the gate circuit 13. The gate circuit 13 comprises, in the illustrated embodiment, seven AND gates, namely, first, second, third, . . . , seventh AND gates A1, A2, A3, . . . , A7. The first delay data S1D is supplied to one inputs of the first, the second and the third AND gates A1, A2 and A3, the second delay data S2D is supplied to one inputs of the fourth and fifth AND gates A4 and A5, the third delay data S3D is supplied to only one input of the sixth AND gate A6, and the fourth delay data S4D is supplied to only one input of the seventh AND gate A7.

An output of the first AND gate A1 is connected to all of the first to the fourth delay means DLa–DLd, an output of the second AND gate A2 is connected to the first and the third delay means DLa and DLc, an output of the third AND gate A3 is connected to only the first delay means DLa, an output of the fourth AND gate A4 is connected to the second and the fourth delay means DLb and DLd, an output of the fifth AND gate A5 is connected to only the second delay means DLb, an output of the sixth AND gate A6 is connected to only the third delay means DLc, and an output of the seventh AND gate A7 is connected to only the fourth delay means DLd. As a result, in the illustrated embodiment, a selected one of outputs of three AND gates is supplied to each of the delay means DLa–DLd. However, it is arranged that only the first delay data S1D is supplied to the first delay means DLa, a selected one of the first and the second delay data S1D and S2D is supplied to the second delay means DLb, a selected one of the first and the third delay data S1D and S3D is supplied to the third delay means DLc, and a selected one of the first, the second and the fourth delay data S1D, S2D and S4D is supplied to the fourth delay means DLd.

These delay means DLa–DLd have their amounts (lengths) of delay time set by the delay data supplied thereto, and give their set delay times to the original strobe pulses SA'–SD' from the first to the fourth strobe pulse generators, respectively.

The AND gates A1–A7 of the gate circuit 13 are enabled when a mode signal is supplied from a mode selection circuit 9 to the other inputs of the AND gates A1–A7, thereby to pass the delay data supplied thereto from the delay data generator 12 therethrough.

It is arranged in the illustrated embodiment that one of three modes, namely, mode 1, mode 2 and mode 3 can be set by the mode selection circuit 9. When the mode 1 is set, a mode signal 1 is correspondingly generated from the mode selection circuit 9, when the mode 2 is set, a mode signal 2 is correspondingly generated from the mode selection circuit 9, and when the mode 3 is set, a mode signal 3 is correspondingly generated from the mode selection circuit 9.

The mode selection circuit 9 includes a mode switch SW which is a rotary type change-over switch having three fixed contacts "a", "b", "c" and a movable contact "d". The movable contact "d" is connected to the positive electrode or terminal of a power source E, and the fixed contacts "a", "b" and "c" are connected to output terminals O1, O2 and O3 of the mode selection circuit 9 respectively as well as connected to a common potential point or grounded through resistors R1, R2 and R3, respectively. Further, the negative electrode or terminal of the power source E is connected to the common potential point or grounded. Accordingly, a mode signal of logical high level (H level) is outputted from one of the fixed contacts to which the movable contact "d" is connected.

When the movable contact "d" of the mode switch SW is connected to its fixed contact "a", "mode 1" is selected and the first mode signal M1 is outputted from the corresponding output terminal O1 to be sent to the other input of the AND gate A1 of the gate circuit 13, the delay data generator 12, the strobe generator 6, and the failure selection circuit 7. When the movable contact "d" of the mode switch SW is connected to its fixed contact "b", "mode 2" is selected and the second mode signal M2 is outputted from the corresponding output terminal O2 to be sent to the other inputs of the AND gates A2 and A4 of the gate circuit 13, the delay data generator 12, the strobe generator 6, and the failure selection circuit 7. When the movable contact "d" of the mode switch SW is connected to its fixed contact "c", "mode 3" is selected and the second mode signal M3 is outputted from the corresponding output terminal O3 to be sent to the other inputs of the AND gates A3, A5, A6 and A7 of the gate circuit 13, the delay data generator 12, the strobe generator 6, and the failure selection circuit 7.

In consequence of these mode signals M1, M2 and M3 given to the strobe generator 6, original strobe pulses SA', SB', SC' and SD' are generated from the first, the second, the third and the fourth strobe pulse generators of the strobe generator 6. These original strobe pulses SA', SB', SC' and SD' have the same frequency fs (fs=1/T) and different phases (timings) from one another.

Figure 3:
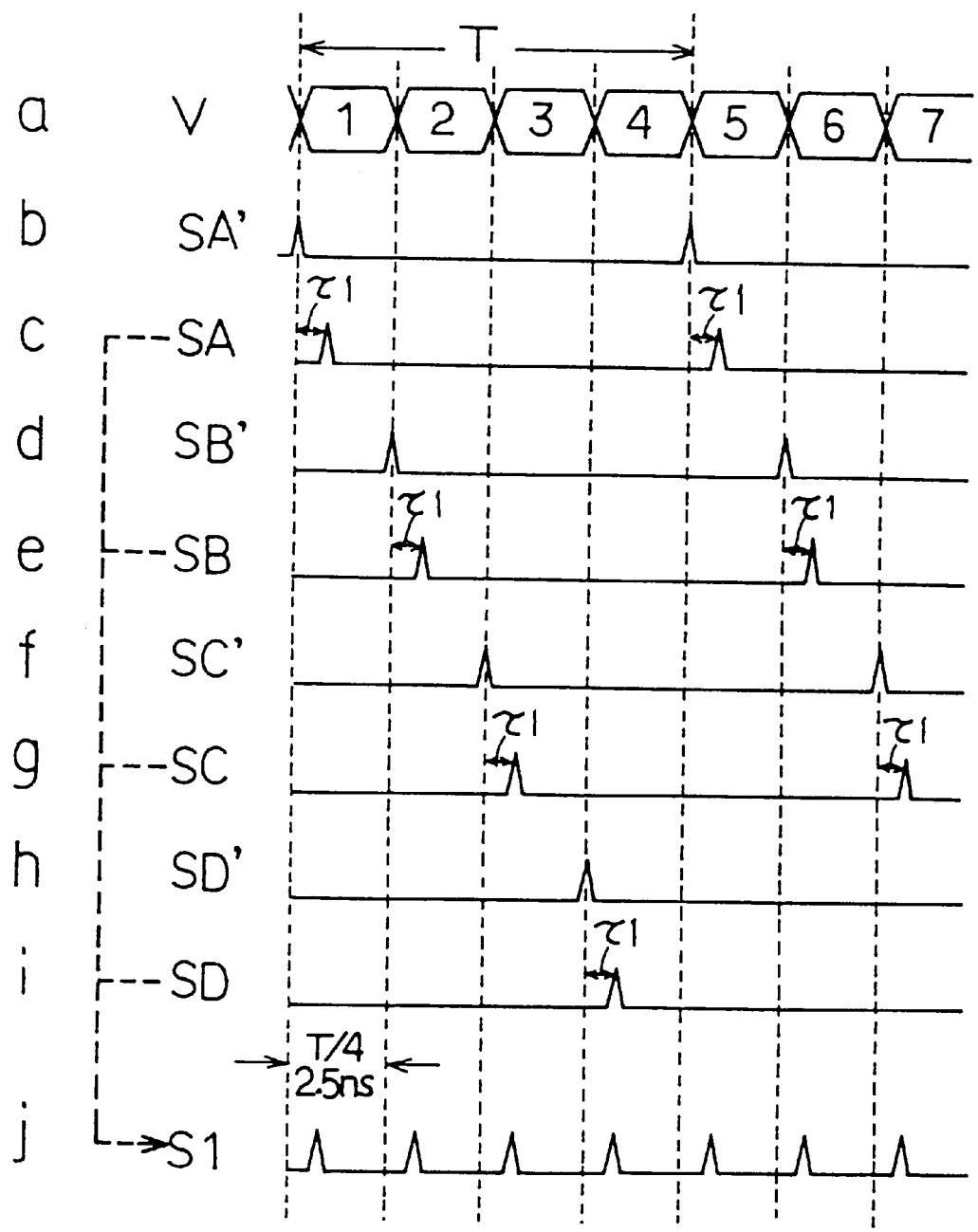
FIG. 3 is a timing chart showing strobe pulses outputted from the strobe generator and strobe pulses inputted into the failure selection circuit respectively when the mode 1 is selected in the IC memory testing apparatus shown in FIG. 1.

In the illustrated embodiment, in case the mode 1 is selected, the phases of the original strobe pulses are set such that they are delayed T/4 by T/4 in order from the first original strobe signal SA' the phase of which is the reference, as shown in FIG. 3. Accordingly, during any one test period T (10 ns, for instance) of a series of test periods constituting one test cycle, the four original strobe pulses SA', SB', SC' and SD' having different phases from one another can be generated, and since each test period T is divided into four cycles, it is possible to generate a high speed strobe pulse S1 having a frequency equal to the frequency fs multiplied by 4, namely, 4×fs as shown in FIG. 3j.

Figure 5:
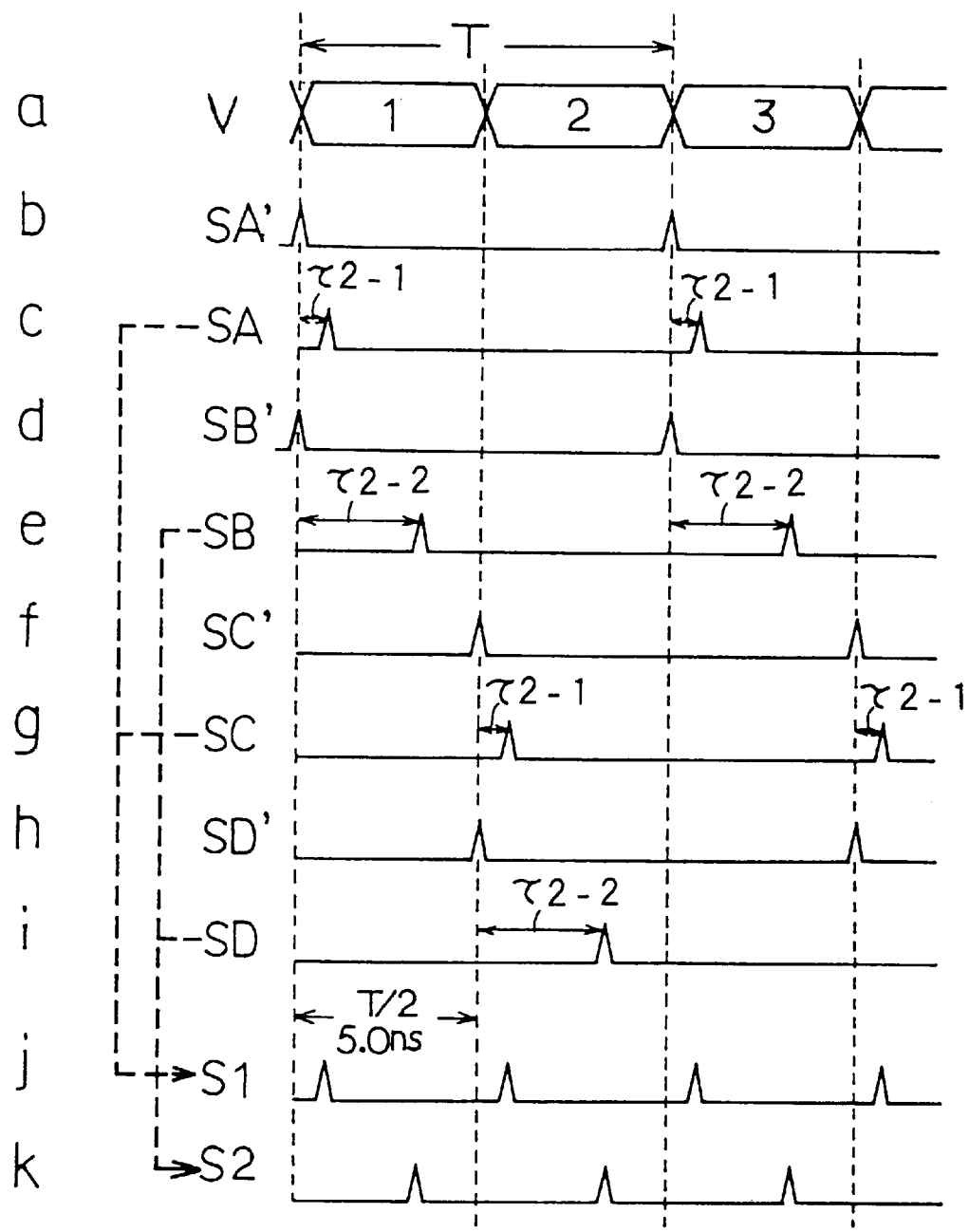
FIG. 5 is a timing chart showing strobe pulses outputted from the strobe generator and strobe pulses inputted into the failure selection circuit respectively when the mode 2 is selected in the IC memory testing apparatus shown in FIG. 1.

In case the mode 2 is selected, the phases of the original strobe pulses are set such that the phases of the original first strobe pulse SA' and the original second strobe pulse SB' are identical (in the illustrated example, the reference phase) and the phases of the original third strobe pulse SC' and the original fourth strobe pulse SD' are identical and delayed by T/2 from the phase of the original first or second strobe pulse SA' or SB', as shown in FIG. 5. Accordingly, though the four original strobe pulses SA', SB', SC' and SD' can be generated during any one test period T, each test period T is divided into only two cycles, and hence it is possible in the mode 2 to generate a strobe pulse which is the sum of strobe pulses S1 and S2 shown in FIGS. 5j and 5k respectively and has a frequency equal to the frequency fs multiplied by 2, namely, 2×fs.

Figure 7:
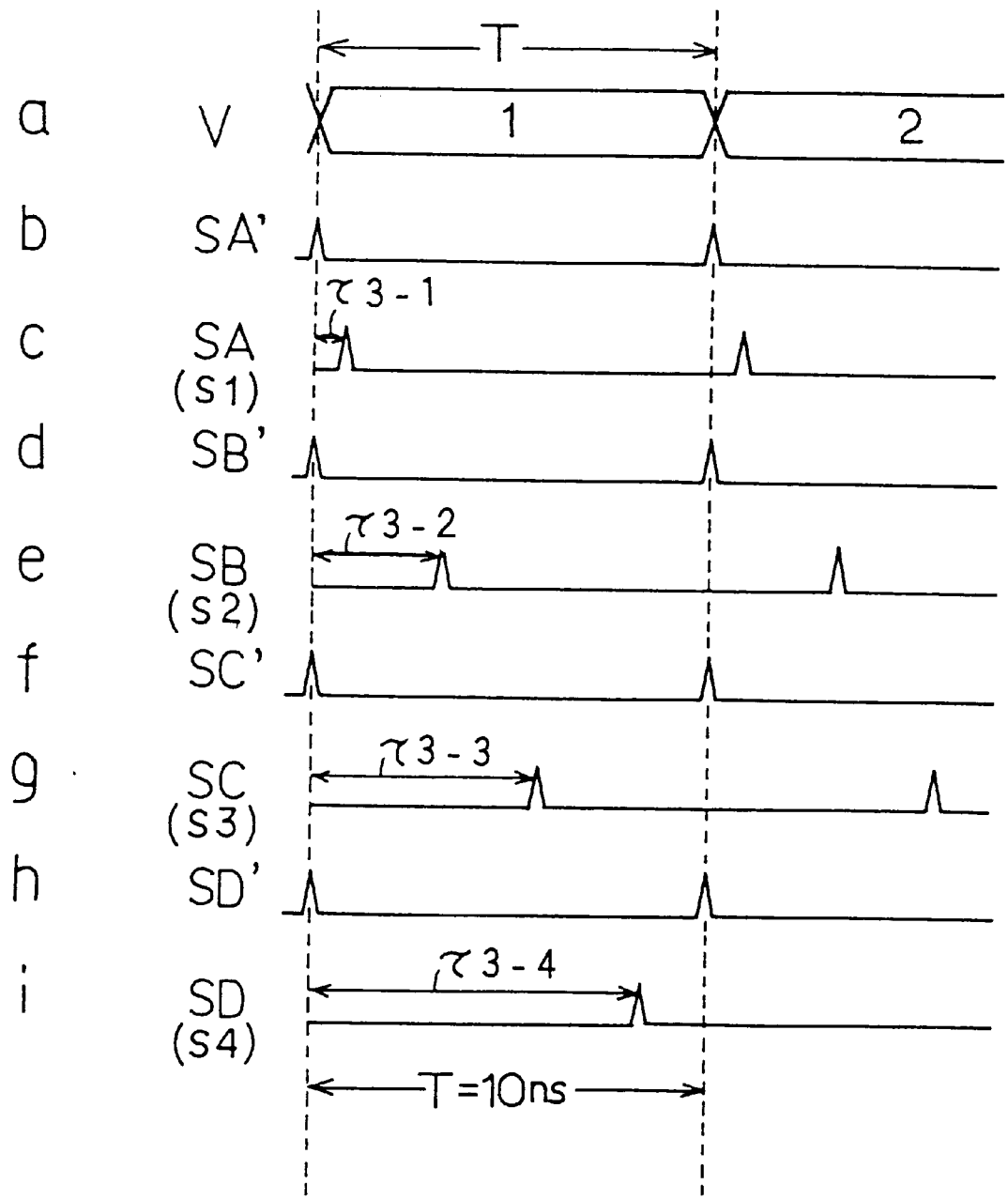
FIG. 7 is a timing chart showing strobe pulses outputted from the strobe generator and strobe pulses inputted into the failure selection circuit respectively when the mode 3 is selected in the IC memory testing apparatus shown in FIG. 1.

In case the mode 3 is selected, the phases of the original strobe pulses are set such they are all identical (in the illustrated example, the reference phase) as shown in FIG. 7. Accordingly, though the four original strobe pulses SA', SB', SC' and SD' can be generated during any one test period T, each test period T is not divided in the mode 3, and hence it is possible to generate a strobe pulse having the same frequency as that of the original strobe pulse or the test data signal, namely, fs.

Putting together the above-stated results of the phase relationship between the original strobe signals SA', SB', SC' and SD', it is as shown in FIG. 9.

The original strobe pulses SA'–SD' outputted from the strobe generator 6 are inputted to the delay circuit 14 of the strobe control circuit 10 as described above where they are given predetermined delay times according to each mode by the corresponding delay means DLa–DLd while the original strobe pulses SA'–SD' pass through the corresponding delay means DLa–DLd. That is, the original strobe pulses SA'–SD' are altered into strobe pulses SA–SD adapted for each mode in the delay circuit 14, which are supplied from the 10 output terminals P1–P4 of the strobe control circuit 10 to the corresponding logical comparator circuits 5-1 to 5-4, respectively.

The delay data to be set in the delay means DLa–DLd in accordance with each mode are given from the delay data generator 12 to the delay means via the gate circuit 13, respectively. The delay data generator 12 supplies, in response to one mode signal (any one of M1, M2 and M3) inputted thereto, the delay data (signals) S1D–S4D corresponding to the mode signal to the gate circuit 13.

In this embodiment, when the mode 1 is selected by the mode selection circuit 9 and the mode signal M1 is inputted to the delay data generator 12, all of the delay data S1D–S4D are set to have a delay time of $\tau 1$ ($0 \leq \tau 1 < T/4$), as shown in FIG. 3. When the mode signal M2 is inputted to the delay data generator 12, the delay data S1D–S4D are set such that the delay data S1D and S3D have the same delay time of $\tau 2\text{-}1$ and the delay data S2D and S4D have the same delay time of $\tau 2\text{-}2$ which is different from the delay time $\tau 2\text{-}1$, as shown in FIG. 5. These delay times $\tau 2\text{-}1$ and $\tau 2\text{-}2$ have the relationship of $0 \leq \tau 2\text{-}1 < \tau 2\text{-}2 < T/2$. When the mode signal M3 is inputted to the delay data generator 12, the delay data S1D–S4D are set such that they have delay times of $\tau 3\text{-}1$, $\tau 3\text{-}2$, $\tau 3\text{-}3$ and $\tau 3\text{-}4$ which increase in time within the time interval from 0 to T in order of S1D, S2D, S3D and S4D, as shown in FIG. 7. That is, these delay times have the relationship of $0 \leq \tau 3\text{-}1 < \tau 3\text{-}2 < \tau 3\text{-}3 \leq \tau 3\text{-}4 < T$.

Putting together the above-stated results of the relationship between the delay data S1D–S4D, it is as shown in FIG. 10.

The seven AND gates A1–A7 constituting the gate circuit 13 are selectively enabled in response to one mode signal (any one of M1, M2 and M3) inputted thereto, thereby to give the delay data S1D–S4D corresponding to the selected mode to the delay means DLa–DLd.

When the mode 1 is selected by the mode selection circuit 9 and the mode signal M1 is inputted to the gate circuit 13, only the first AND gate A1 is enabled so that the delay data S1D (the amount of delay time $\tau 1$) is set in each of the delay means DLa–DLd. When the mode signal M2 is inputted to the gate circuit 13, the second AND gate A2 and the fourth AND gate A4 are enabled so that the delay data S1D (the amount of delay time $\tau 2\text{-}1$) is set in each of the first and the third delay means DLa and DLc and the delay data S2D (delay time $\tau 2\text{-}2$) is set in each of the second and the fourth delay means DLb and DLd. When the mode signal M3 is inputted to the gate circuit 13, the third, the fifth, the sixth and the seventh AND gates A3, A5, A6 and A7 are enabled so that the delay data S1D (the amount of delay time $\tau 3\text{-}1$) is set in the second delay means DLa, the delay data S2D (the amount of delay time $\tau 3\text{-}2$) is set in the second delay means DLb, the delay data S3D (the amount of delay time $\tau 3\text{-}3$) is set in the third delay means DLc, and the delay data S4D (the amount of delay time $\tau 3\text{-}4$) is set in the delay means DLd.

The original strobe pulses SA'–SD' are controlled by the delay means DLa–DLd to have their phases corresponding to each mode and thereafter are supplied to the corresponding logical comparator circuits 5-1–5-4 as new strobe pulses SA–SD. Each of the logical comparator circuits 5-1–5-4 compares the value of the output signal V from the level comparator 2 strobed at the fall edge, in this example, of the associated one of the strobe pulses SA–SD with the corresponding one of the expected value signals E1–E4, respectively. As with the prior logical comparator circuits, each of the logical comparator circuits 5-1–5-4 outputs, when the result of comparison is a nonconformity, the corresponding one of the failure signals F1–F4 indicating the nonconformity, logical "1" in this example. On the contrary, when the result of comparison is a conformity, each of the logical comparator circuits 5-1–5-4 outputs the corresponding one of the pass signals indicating the conformity, logical "0" in this example.

The failure signals F1–F4 outputted from the logical comparator circuits 5-1–5-4 are inputted to the failure selection circuit 7. The failure selection circuit 7 selects from failure analysis memories 8-1–8-4 one or more failure analysis memories in which the inputted failure signal is to be stored in accordance with the mode signal M1, M2 or M3 inputted to the failure selection circuit 7 and one or more strobe selection signals SiSEL (i=1 through 4) to store the inputted failure signal in the selected one or more failure analysis memories.

Figure 2:
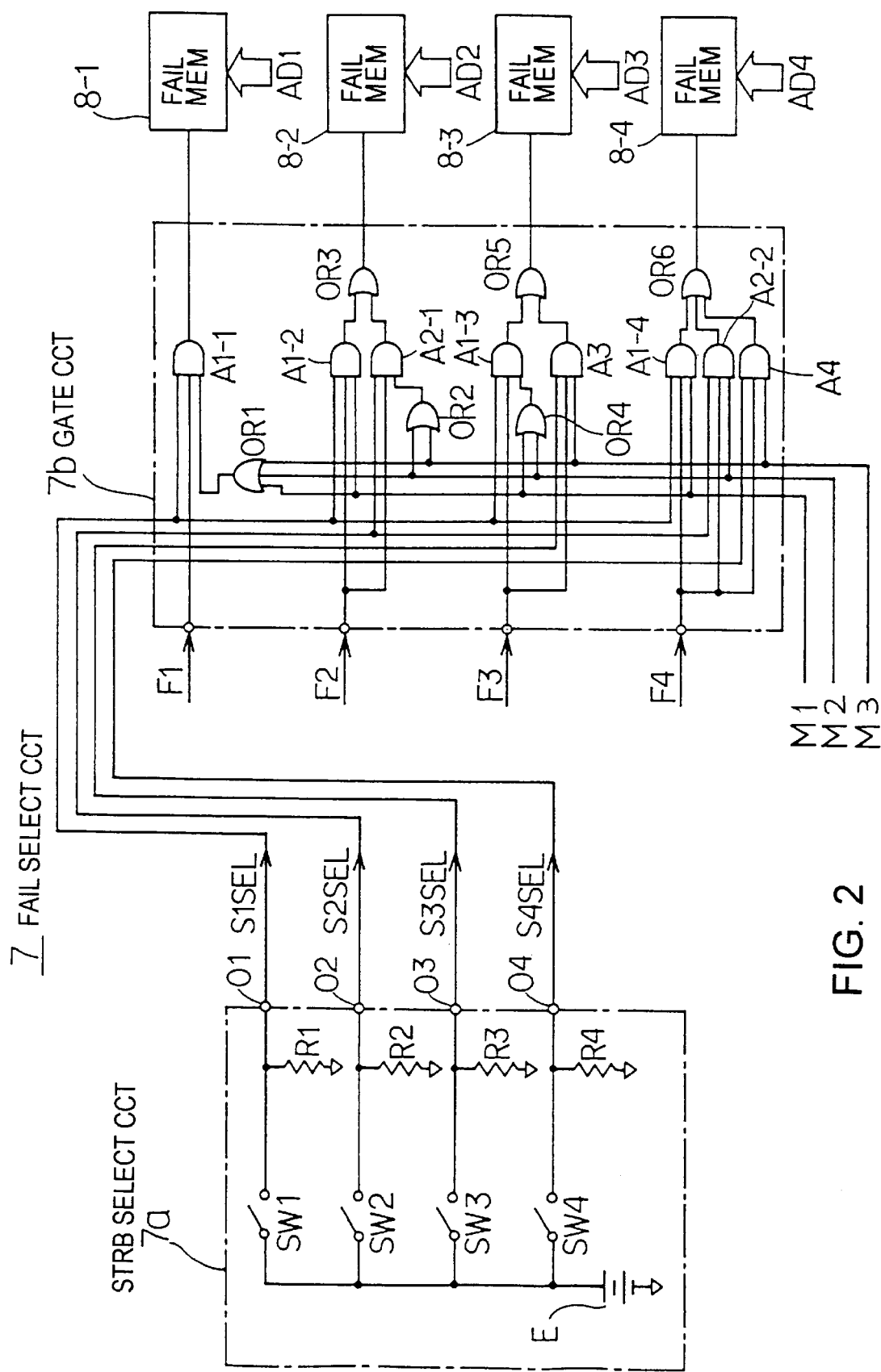
FIG. 2 is a schematic circuit diagram showing a specific example of the failure selection circuit used in the IC memory testing apparatus shown in FIG. 1.

One specific example of the failure selection circuit 7 is shown in FIG. 2. The failure selection circuit 7 comprises a strobe selection circuit 7a and a gate circuit 7b. The strobe selection circuit 7a includes four, namely, the first, the second, the third and the fourth strobe selecting switches SW1, SW2, SW3 and SW4 one terminals of which are all connected to the positive terminal of the power source E and the other terminals of which are connected to the output terminals O1–O4 of the strobe selection circuit 7a respectively as well as connected to the common potential point or grounded via resistors R1, R2, R3 and R4, respectively. Further, the other terminal of the power source E is connected to the common potential point or grounded.

The first strobe selecting switch SW1 is always controlled to go to ON state when the mode 1 is selected and is controlled selectively to go to ON state when the mode 2 or mode 3 is selected so that a first strobe selecting signal S1SEL of logical high (H) level is generated at the output terminal O1 of the strobe selection circuit 7a. The second strobe selecting switch SW2 is controlled selectively to go to ON state when the mode 2 or mode 3 is selected so that a second strobe selecting signal S2SEL of H level is generated at the output terminal O2 of the strobe selection circuit 7a. The third and the fourth strobe selecting switches SW3 and SW4 are controlled selectively to go to ON state when the mode 3 is selected so that a third and a fourth strobe selecting signals S3SEL and S4SEL each of H level are generated at the output terminals O3 and O4 of the strobe selection circuit 7a, respectively.

The first strobe selecting signal S1SEL is inputted to four AND gates A1-1, A1-2, A1-3 and A1-4 of the gate circuit 7b, respectively, and the second strobe selecting signal S2SEL is inputted to two AND gates A2-1 and A2-2, respectively. In addition, the third strobe selecting signal S3SEL is inputted to only an AND gate A3, and the fourth strobe selecting signal S4SEL signal is inputted to only an AND gate A4. Thus, all the AND gates have their one input terminals supplied with one of the SiSEL signals (i=1–4).

When the mode 1 is selected, the mode signal M1 of H level is given to the AND gates A1-1 and A1-3 through OR gates OR1 and OR4 respectively as well as directly to the AND gates A1-2 and A1-4. At the same time, the AND gates A1-1–A1-4 have the first strobe selecting signal S1SEL supplied thereto respectively as mentioned above. As a result, the AND gates A1-1–A1-4 are enabled so that the failure signals F1–F4 are inputted to the corresponding failure analysis memories 8-1–8-4 to be stored therein, respectively.

When the mode 2 is selected, the mode signal M2 of H level is given to the AND gates A1-1, A2-1 and A1-3 through OR gates OR1, OR2 and OR4 respectively as well as directly to the AND gate A2-2. Therefore, if the first strobe selecting signal S1SEL is generated, the AND gates A1-1 and A1-3 are enabled so that the failure signal F1 (the failure information in the odd cycles of the strobe signal S1) and the failure signal F3 (the failure information in the even cycles of the strobe signal S1) are stored in the corresponding failure analysis memories 8-1 and 8-3, respectively. On the contrary, if the second strobe selecting signal S2SEL is generated, the AND gates A2-1 and A2-2 are enabled so that the failure signal F2 (the failure information in the odd cycles of the strobe signal S2) and the failure signal F4 (the failure information in the even cycles of the strobe signal S2) are stored in the corresponding failure analysis memories 8-2 and 8-4, respectively. Further, the first strobe selecting signal S1SEL and the second strobe selecting signal S2SEL may be generated at the same time. In such case, all the failure signals F1–F4 are stored in the corresponding failure analysis memories 8-1–8-4, respectively.

When the mode 3 is selected, the mode signal M3 of H level is inputted to the AND gates A1-1 and A2-1 through OR gates OR1 and OR2 respectively as well as directly to the AND gates A3 and A4. Therefore, if the first strobe selecting signal S1SEL is generated, only the AND gate A1-1 is enabled so that only the failure signal F1 (the failure information in each cycle of the strobe signal S1) is stored in the corresponding failure analysis memory 8-1. If the second strobe selecting signal S2SEL is generated, only the AND gates A2-1 is enabled so that the failure signal F2 (the failure information in each cycle of the strobe signal S2) is stored in the corresponding failure analysis memory 8-2. In addition, if the third strobe selecting signal S3SEL or the fourth strobe selecting signal S4SEL is generated, the AND gate A3 or A4 is enabled so that the failure signal F3 (the failure information in each cycle of the strobe signal S3) or the failure signal F4 (the failure information in each cycle of the strobe signal S4) is stored in the corresponding failure analysis memory 8-3 or 8-4. Further, arbitrary plural strobe selecting signals among the first to the fourth four strobe selecting signals S1SEL–S4SEL may be generated at the same time.

Next, the operation of the logical comparison part thus constructed will be described for each of the cases the first, the second and the third modes are selected.

Figure 4:
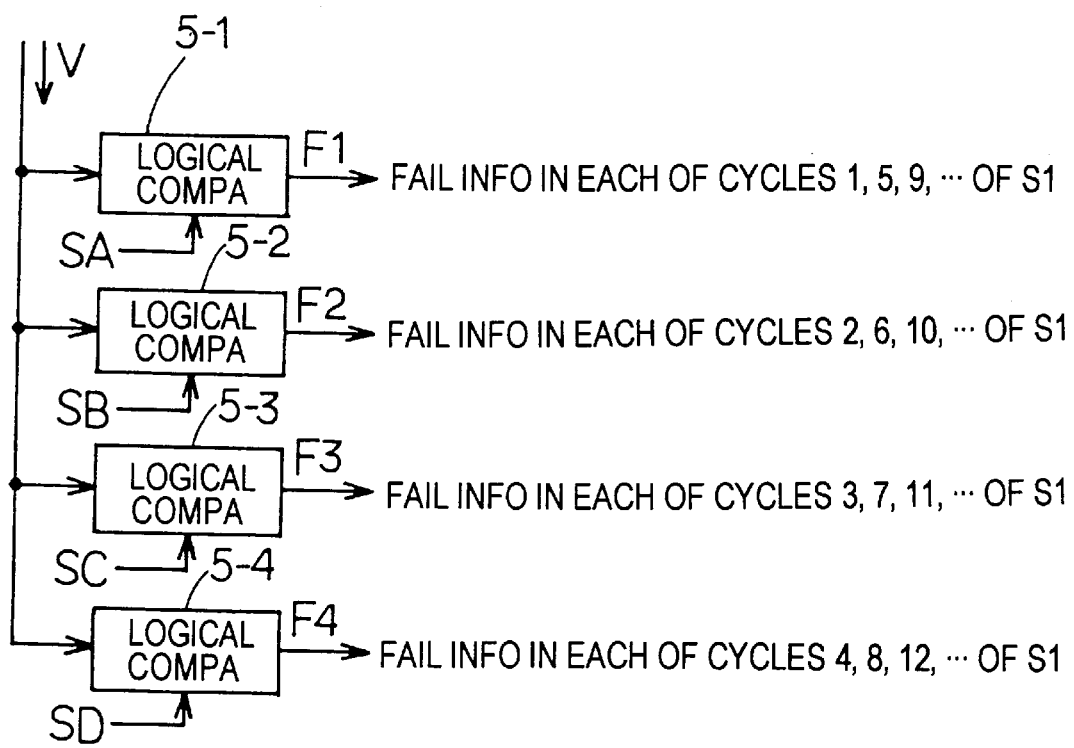
FIG. 4 is a diagram for explaining the contents of the failure signals (F1–F4) outputted from the logical comparator circuits when the mode 1 is selected in the IC memory testing apparatus shown in FIG. 1.

The mode 1 is one in which a test for an IC memory to be tested is carried out using a new high speed strobe signal S1 (FIG. 3j) having a frequency four times the frequency fs (for example, 100 MHz) of the original strobe pulses SA'–SD' generated by the four strobe pulse generators of the strobe generator 6 under a constant phase condition (τ1) and by applying a series of test data signals of a predetermined pattern having a frequency ft=4 fs to the IC memory to be tested, as shown in FIGS. 3 and 4.

In case the mode 1 is selected, the failure selection circuit 7 must select the first strobe selecting signal S1SEL as a strobe selecting signal to be supplied to the gate circuit 7b of the failure selection circuit 7. By selecting the first strobe selecting signal S1SEL, the failure signals F1–F4 outputted from the logical comparator circuits 5-1–5-4 are stored in the corresponding failure analysis memories 8-1–8-4, respectively.

As is understood from FIG. 4, the failure signal F1 outputted from the logical comparator circuit 5-1 becomes the failure information in each of the test periods 1, 5, 9, . . . of the strobe signal S1, the failure signal F2 outputted from the logical comparator circuit 5-2 becomes the failure information in each of the test periods 2, 6, 10, . . . of the strobe signal S1, the failure signal F3 outputted from the logical comparator circuit 5-3 becomes the failure information in each of the test periods 3, 7, 11, . . . of the strobe signal S1, and the failure signal F4 outputted from the logical comparator circuit 5-4 becomes the failure information in each of the test periods 4, 8, 12, . . . of the strobe signal S1.

Figure 6:
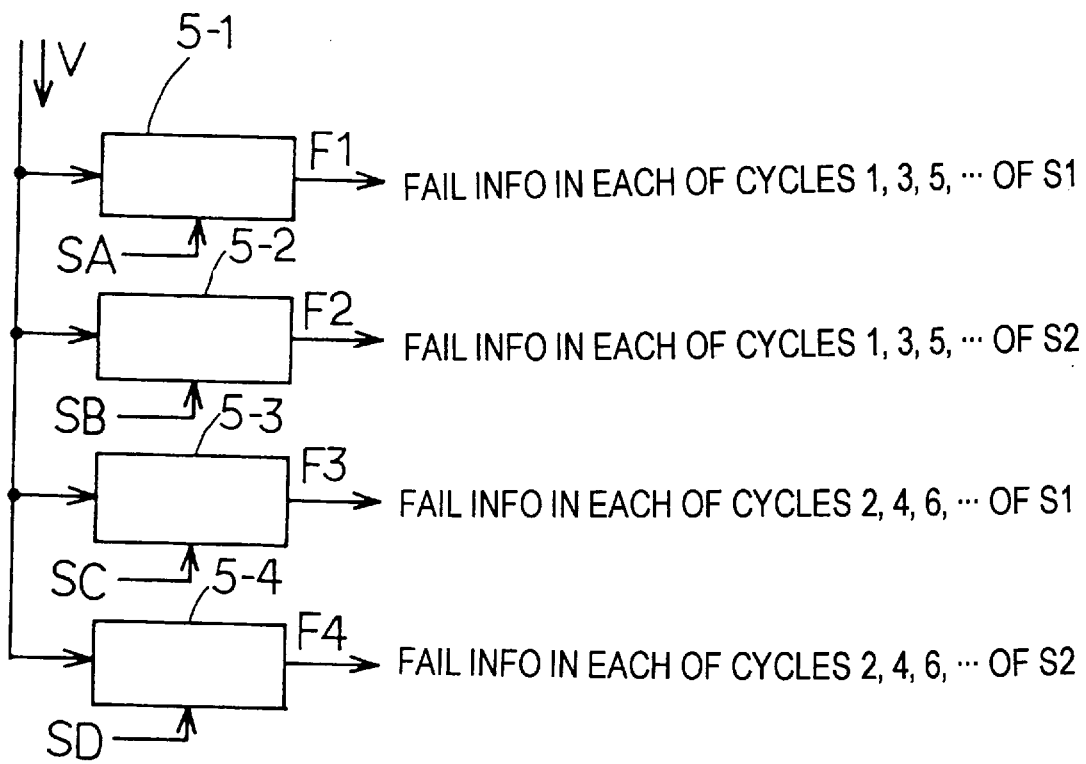
FIG. 6 is a diagram for explaining the contents of the failure signals (F1–F4) outputted from the logical comparator circuits when the mode 2 is selected in the IC memory testing apparatus shown in FIG. 1.

The mode 2 is one in which a test for an IC memory to be tested is carried out using two new high speed strobe signals S1 and S2 (FIGS. 5j and 5k) having a frequency two times the frequency fs of the original strobe pulse generated by each of the four strobe pulse generators of the strobe generator 6 with different phases from each other, and by applying a series of test data signals of a predetermined pattern having a frequency ft=2 fs to the IC memory to be tested, as shown in FIGS. 5 and 6. That is, the test is performed by using the test data signals the frequency ft of which is doubled and by strobing at two comparison timings (also called comparison edges) having different phases from each other.

In case the mode 2 is selected, the failure selection circuit 7 may select only one of the first strobe selecting signal S1SEL and the second strobe selecting signal S2SEL or both of them as a strobe selecting signal or signals to be supplied to the gate circuit 7b of the failure selection circuit 7.

As is understood from FIG. 6, the failure signal F1 outputted from the logical comparator circuit 5-1 becomes the failure information in each of the test periods 1, 3, 5, . . . of the strobe signal S1, the failure signal F2 outputted from the logical comparator circuit 5-2 becomes the failure information in each of the test periods 1, 3, 5, . . . of the strobe signal S2, the failure signal F3 outputted from the logical comparator circuit 5-3 becomes the failure information in each of the test periods 2, 4, 6, . . . of the strobe signal S1, and the failure signal F4 outputted from the logical comparator circuit 5-4 becomes the failure information in each of the test periods 2, 4, 6, . . . of the strobe signal S2.

Figure 8:
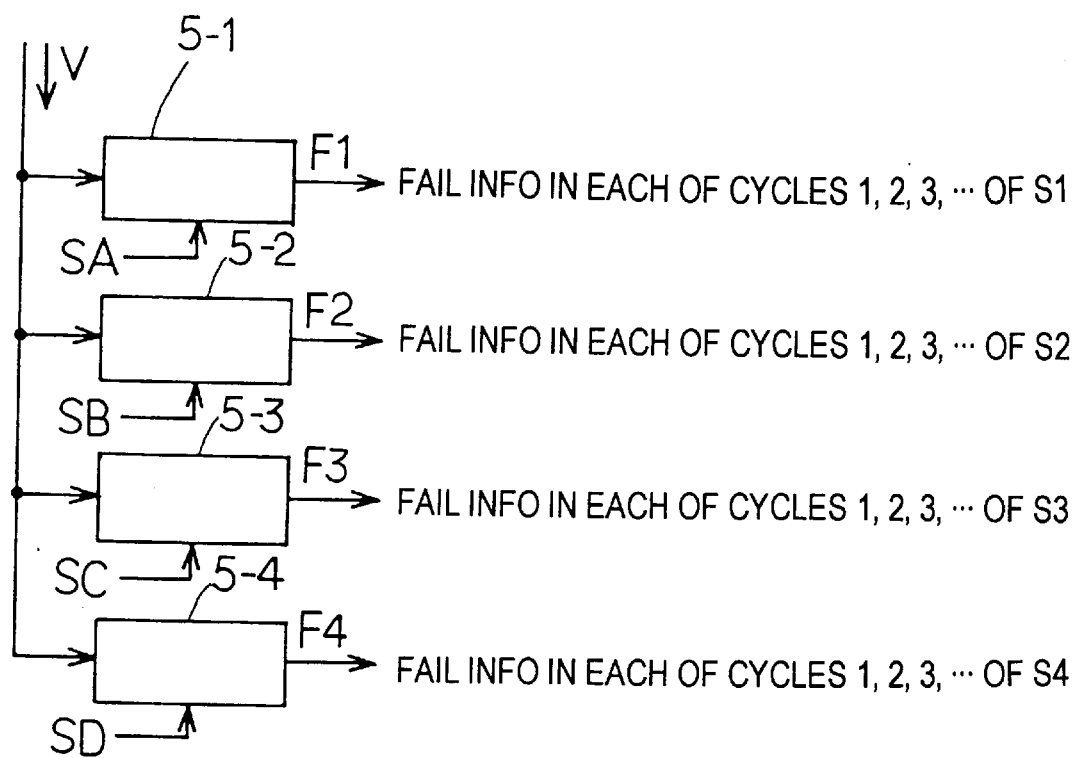
FIG. 8 is a diagram for explaining the contents of the failure signals (F1–F4) outputted from the logical comparator circuits when the mode 3 is selected in the IC memory testing apparatus shown in FIG. 1.

The mode 3 is one in which a test for an IC memory to be tested is carried out using four new strobe signals S1–S4 having the same frequency as the frequency fs of the original strobe pulse generated by each of the four strobe pulse generators of the strobe generator 6 with different phases from one another, and by applying a series of test data signals of a predetermined pattern having a frequency ft=fs to the IC memory to be tested, as shown in FIGS. 7 and 8.

In case the mode 3 is selected, the failure selection circuit 7 can select any one or a plurality of the first to the fourth strobe selecting signals S1SEL–S4SEL as a strobe selecting signal or signals to be supplied to the gate circuit 7b of the failure selection circuit 7.

As is understood from FIG. 8, the failure signal F1 outputted from the logical comparator circuit 5-1 becomes the failure information in each of the test periods 1, 2, 3, . . . of the strobe signal S1, the failure signal F2 outputted from the logical comparator circuit 5-2 becomes the failure information in each of the test periods 1, 2, 3, . . . of the strobe signal S2, the failure signal F3 outputted from the logical comparator circuit 5-3 becomes the failure information in each of the test periods 1, 2, 3, . . . of the strobe signal S3, and the failure signal F4 outputted from the logical comparator circuit 5-4 becomes the failure information in each of the test periods 1, 2, 3, . . . of the strobe signal S4.

In accordance with the IC memory testing apparatus having the logical comparison part constructed above, the strobe generator 6 is constructed by four strobe pulse generators for generating original strobe pulses having the same frequency, respectively, and correspondingly, four logical comparator circuits the number of which is identical to that of the strobe pulse generators are provided. As a result, any one of the mode 1, mode 2 and mode 3 can be set by the mode selection circuit 9 wherein the mode 1 is one in which an output signal V from the level comparator 2 is latched into by a new high speed strobe signal having a frequency four times the frequency fs of the original strobe pulse, and the latched signals are sequentially compared with the expected value data signals; the mode 2 is one in which an output signal V from the level comparator 2 is latched into by two new high speed strobe signals having a frequency two times the frequency fs of the original strobe pulse, and the latched signals are sequentially compared with the expected value data signals; and the mode 3 is one in which an output signal V from the level comparator 2 is latched into by four new strobe signals having the same frequency as the frequency fs of the original strobe pulse and different phases from one another, and the latched signals are sequentially compared with the expected value data signals.

Accordingly, when the mode 1 is set, the output signal V from the level comparator 2 is strobed every T/4 cycle by four strobe signals having the same phase in each test period T, and hence, assuming that the frequency fs of the original strobe pulse is, for example, 100 MHz, the output signal V from the level comparator 2 can be latched into by the strobe signal having the highest frequency of 400 MHz which is four times the frequency fs. Thus, it is possible to test any IC memory which operates at high speed.

When the mode 2 is set, the output signal V from the level comparator 2 is strobed every T/2 cycle by two strobe signals having different phases from each other in each test period T, and hence, assuming that the frequency fs of the original strobe pulse is, for example, 100 MHz, the output signal V from the level comparator 2 can be latched into by the strobe signal having a frequency of 200 MHz which is two times the frequency fs. Thus, it is possible to test any IC memory which operates at high speed. In addition, since two kinds of failure information can be latched into at the same time, it is possible to shorten the time interval needed for testing IC memories.

When the mode 3 is set, the output signal V from the level comparator 2 is strobed by four strobe signals having different phases from one another in each test period T. In such case, though the frequency of each of the strobe signals is the same as the frequency fs of the original strobe pulse, four kinds of failure information can be latched into at the same time, and it is possible to greatly shorten the time interval needed for testing IC memories.

For example, in case of classifying DRAMs into four categories with respect to the access times thereof, two test cycles are needed to perform such classification in the mode 2 because only two kinds of failure information can be latched into at the same time. On the contrary, in the mode 3, four kinds of failure information can be latched into at the same time, and hence such classifying operation or work can be completed by only one test cycle. Consequently, there is a remarkable advantage that the time interval required for testing IC memories can be decreased to substantially a half (½).

In the above embodiment, there is described by way of example a case that four strobe signal generators and four logical comparator circuits are provided, namely, four channels each comprising one strobe signal generator and one logical comparator circuit are provided. However, the number of strobe signal generators and logical comparator circuits, i.e., the number of channels may be increased. In case more than four channels of strobe signal generators and logical comparator circuits are provided, various modes can be provided as required in addition to the mode 1, mode 2 and mode 3. In addition, an output signal V from the level comparator 2 can be latched into by the strobe signal having a frequency five times the frequency of the original strobe signal or higher than five times.

Also, in case more than two channels of strobe signal generators and logical comparator circuits are provided, an output signal V from the level comparator 2 can be latched into by the strobe signal having a frequency two times the frequency of the original strobe signal or higher than two times. Therefore, there is an advantage that it is possible to test any IC memory which operates at high speed corresponding to a frequency two times the frequency of the original strobe signal or higher than two times, and which cannot be tested by the conventional IC memory testing apparatus described above.

In addition, in the above embodiment, there is described by way of example a case that the failure selection circuit 7 has the strobe selection circuit 7a provided therewithin, but the strobe selection circuit 7a may be provided outside of the failure selection circuit 7.

Further, if an expected value data generator is provided for each logical comparator circuit, it is possible to change expected data for each strobe signal on the same pin of an IC memory to be tested and/or in the same test period.

Accordingly, it is possible to carry out various tests in a short time.

In the foregoing, it is arranged that each of timings of generation of the new strobe signals SA–SD in each mode is determined by a timing of generation (FIG. 9) of each of the original strobe pulses of the strobe generator 6 and the amount of delay time (FIG. 10) given by the strobe control circuit 10. However, the present invention is not limited to such construction of the embodiment. For example, it is needless to say that all of the timings of generation of the original strobe pulses of the strobe generator 6 may be the same time and each of timings of generation of the new strobe signals SA–SD in each mode is determined by only the amount of delay time given by the strobe control circuit 10.

In the above embodiment, the present invention will be described with a case that the present invention is applied to an IC memory testing apparatus for testing one or more IC memories as to whether it is a good (pass) article or a defective (failure) article. However, it is needless to say that the present invention can also be applied to a semiconductor device testing apparatus for testing one or more ICs other than an IC memory or one or more semiconductor devices other than an IC as to whether it is a pass article or a failure article, and that the same functional effects can be obtained.

As described above, with the present invention a semiconductor device testing apparatus is provided in which each test period in one test cycle and a timing for logical comparison can be variously changed, and hence there is obtained a remarkable advantage that all of semiconductor devices from low speed semiconductor devices operating at a low speed to high speed semiconductor devices operating at a high speed can be tested regarding their various performances by only one semiconductor device testing apparatus. That is, it is possible to greatly increase the convenience and facilitation of a semiconductor device testing apparatus.

What is claimed is:

1. A semiconductor device testing apparatus wherein a series of test data signals of a predetermined pattern is applied to a semiconductor device to be tested, a read-out data signal read out from said semiconductor device is logically compared with an expected value data signal in a logical comparison circuit, and when the result of comparison is a discord, a failure signal indicating the discord is outputted to be stored in a failure analysis memory, said semiconductor device testing apparatus comprising:
 a plurality of strobe generators generating original strobe signals having the same frequency, respectively;
 a plurality of logical comparator circuits, each logical comparator circuit logically comparing a portion of the readout data signal from said semiconductor device latched thereinto by corresponding one original strobe signal with an expected value data signal supplied thereto, and when the result of comparison is a discord, generating a failure signal, the number of said logical comparator circuits being equal to that of said strobe generators;
 a strobe control circuit provided between said plurality of strobe generators and said plurality of logical comparator circuits, giving predetermined amounts of delay time to original strobe signals generated from said plurality of strobe generators respectively, thereby controlling timings for latching the read-out data signal from the semiconductor device into the corresponding logical comparator circuits; and
 a mode selection circuit at least generating, in each test period of a plurality of test periods constituting one test cycle, a first mode signal which selects a first test mode in which the read-out data signal from the semiconductor device can be latched into the corresponding logical comparator circuits by a new strobe signal of a frequency having the frequency of the original strobe signal multiplied by the number of said strobe generators, and a second mode signal which selects a second test mode in which the read-out data signal from the semiconductor device can be latched into the corresponding logical comparator circuits by a plurality of new strobe signals having the same frequency as that of the original strobe signal and different phases from one another at a plurality of timings.

2. The semiconductor device testing apparatus according to claim 1, wherein said mode selection circuit supplies selected one of said mode signals to said strobe control circuit, and said strobe control circuit changes, in response to the supplied mode signal, the amount of delay time given to the original strobe signal.

3. The semiconductor device testing apparatus according to claim 1, wherein said mode selection circuit supplies selected one of said mode signals to said strobe control circuit and said plurality of strobe generators, and said strobe control circuit changes, in response to the supplied mode signal, the amount of delay time given to the original strobe signal, and each of said plurality of strobe generators changes, in response to the supplied mode signal, the phase of the associated original strobe signal to output it.

4. The semiconductor device testing apparatus according to claim 1, wherein said strobe control circuit comprises: a delay circuit having a plurality of delay means each giving a predetermined amount of delay time to the associated original strobe signal outputted from each of said plurality of strobe generators; a delay data generator previously storing therein delay data corresponding to the amounts of delay time set in said plurality of delay means; and a gate circuit having a plurality of gate means for selectively giving the delay data from said delay data generator to said plurality of delay means, and wherein said delay data generator outputs, in response to a mode signal supplied thereto from said mode selection circuit, the corresponding delay data; and one or more predetermined gate means of said gate circuit are enabled in response to a mode signal supplied thereto from said mode selection circuit.

5. The semiconductor device testing apparatus according to claim 1, wherein the number of said plurality of strobe generators and said plurality of logical comparator circuits are equal to or larger than four, and said mode selection circuit generates at least, in each test period of a number of test periods constituting one test cycle, a first mode signal which selects a first test mode in which the read-out data signal from the semiconductor device can be latched into the corresponding logical comparator circuits by a new strobe signal of a frequency four times the frequency of the original strobe signal or higher than four times, a second mode signal which selects a second test mode in which the read-out data signal from the semiconductor device can be latched into the corresponding logical comparator circuits by a new strobe signal of a frequency two times the frequency of the original strobe signal or higher than two times, and a third mode signal which selects a third test mode in which the read-out data signal from the semiconductor device can be latched into the corresponding logical comparator circuits by four or more new strobe signals having the same frequency as that of the original strobe signal and different phases from one another at four or more timings.

6. The semiconductor device testing apparatus according to claim 5, wherein the number of said plurality of strobe generators and said plurality of logical comparator circuits are an even number equal to or larger than four, and said strobe generators output, when said first mode signal is supplied thereto from said mode selection circuit, in each test period of a number of test periods constituting one test cycle, their original strobe signals the phases of which are delayed T/(4+n) by T/(4+n) in order, where T is one test period and n is an even number including 0;

said strobe generators output, when said second mode signal is supplied thereto from said mode selection circuit, in each test period of a number of test periods constituting one test cycle, the first half of their original strobe signals the phases of which are identical, and then the remaining half of their original strobe signals the phases of which are identical and larger than those of said first half, the phase difference between them being within the time interval of T/2 at the maximum; and said strobe generators output, when said third mode signal is supplied thereto from said mode selection circuit, in each test period of a number of test periods constituting one test cycle, their original strobe signals the phases of which are all identical.

7. The semiconductor device testing apparatus according to claim 1, further comprising:

a plurality of failure analysis memories; and a failure selection circuit selectively supplying the failure signals outputted from said plurality of logical comparator circuits to said failure analysis memories, respectively.

8. The semiconductor device testing apparatus according to claim 7, wherein said failure selection circuit selects, in response to a mode signal supplied thereto from said mode selection circuit, the failure analysis memories in which the failure signals supplied thereto from said plurality of logical comparator circuits are to be stored.

9. A semiconductor device testing apparatus comprising:

strobe generators of a predetermined number each generating an original strobe signal having a same frequency as that of another, each of said strobe generators having at least two operation modes in which the original strobe signals generated by the respective strobe generators have different mutual phase relationships depending on the operation modes;

a strobe control circuit giving the respective original strobe signals predetermined amounts of delay time to thereby generate strobe pulses of the predetermined number, said strobe control circuit having at least two operation modes in which the amounts of delay time given to the respective original strobe signals have different relationships depending on the operation modes;

a level comparator performing level comparison of a read out data signal read out from one of output terminals of a semiconductor device under test to which a series of test data signals of a predetermined pattern has been applied with a reference level;

timing comparator circuits of the predetermined number each provided to correspond to each of said strobe pulses, and supplied commonly with the data signal output from said level comparator, performing timing comparison of the thus supplied data signal with each of said strobe pulses, respectively;

logical comparator circuits of the predetermined number each provided to correspond to each of said timing comparator circuits, performing logical comparison of the data signal supplied from a corresponding timing comparator circuit with an expected value signal, respectively; and a mode selection circuit selectively determining an operation mode from at least the two operation modes of said strobe generators and said strobe control circuit, respectively;

whereby the read-out data signal from the semiconductor device is latched in at least two different manners by means of different strobe pulses depending on the selection of the operation modes by said mode selection circuit.

10. The semiconductor device testing apparatus according to claim 9, wherein said mode selection circuit supplies selected one of at least two mode signals representing said at least two modes to said strobe control circuit, which in turn changes the amounts of delay time to be given to the original strobe signals depending on the mode signal supplied.

11. The semiconductor device testing apparatus according to claim 9, wherein said mode selection circuit supplies a selected one of at least two mode signals representing said at least two modes to said strobe control circuit and said strobe generators, said strobe control circuit charges the amounts of delay time to be given to the original strobe signals in response to the supplied mode signal, and each of said strobe generators provides a change in phase to the associated original strobe signal in response to the supplied mode signal.

12. The semiconductor device testing apparatus according to claim 10, wherein said strobe control circuit comprises:

delay means of said predetermined number each provided to correspond to each of said strobe generators;

a delay data generator previously storing therein delay data which are predetermined in accordance with the respective modes and correspond to the amounts of delay time to be set in said delay means of said predetermined number, and operatively outputting in response to supply thereto of the selected one mode signal from said mode selection circuit; and a gate circuit giving the predetermined delay data outputted from said delay data generator in accordance with supply thereto of the selected one mode to said delay means, whereby respective of said delay means operatively give a predetermined amount of delay time corresponding to the thus supplied delay data to the associated original strobe signal outputted from each of said of strobe generators.

13. The semiconductor device testing apparatus according to claim 9, wherein the predetermined number of said strobe generators is N and said strobe generators generate, when operating in one of said at least two modes, a first set of original strobe signals which have a same frequency to each other and a phase difference of T/N from one to another, where T is one test period of the original strobe signal; and wherein said strobe control circuit provides to the respective original strobe signals, respectively, when operating in one of said at least two modes, an amount of delay time $\tau 1$, wherein $\tau 1$ is $0 \leq \tau 1 < T/N$, so that each said test period T is divided into N cycles, and that the read out data signal from the semiconductor device can be latched in the respective cycles.

14. The semiconductor device testing apparatus according to claim 13, wherein said strobe generators generate, when operating in the other one of said at least two modes, a second set of original strobe signals which have a same frequency and a same phase to each other; and wherein said strobe control circuit provides to the respective original strobe signals, respectively, when operating in the other one of said at least two modes, amounts of delay time $\tau 2\text{-}1, \tau 2\text{-}2, \tau 2\text{-}3, \text{-}\text{-}\text{-}\ \tau 2\text{-}N$, having a relation $0 \leq \tau 2\text{-}1 < \tau 2\text{-}2 < \tau 2\text{-}3 < \text{-}\text{-}\text{-} < \tau 2\text{-}N < \tau T$, so that the read out data signal from the semiconductor device can be latched at N timings within each said test period T.

* * * * *

UNITED STATES PATENT AND TRADEMARK OFFICE
CERTIFICATE OF CORRECTION

PATENT NO.:    6,016,565
DATED     :    January 18, 2000
INVENTOR(S):   Takeo MIURA It is certified that [an/error[s]] appears in the above-identified patent and that said Letters Patent is hereby corrected as shown below:

Col. 10, line 4, delete "10".

Col. 10, line 31, change " $\leq$ " should read -- $<$ --(second occurrence)

Col. 17, line 43, "said" begins a new paragraph.

Signed and Sealed this

Fifth Day of December, 2000

*Attest:*

Q. TODD DICKINSON

*Attesting Officer*    *Director of Patents and Trademarks*